(12) United States Patent
Yoshinaga (10) Patent No.: US 10,923,934 B2
(45) Date of Patent: Feb. 16, 2021

(54) MANAGEMENT DEVICE AND POWER STORAGE SYSTEM

(71) Applicant: SANYO Electric Co., Ltd., Daito (JP)

(72) Inventor: Masayuki Yoshinaga, Hyogo (JP)

(73) Assignee: SANYO Electric Co., Ltd., Daito (JP)

( * ) Notice: Subject to any disclaimer, the term of this patent is extended or adjusted under 35 U.S.C. 154(b) by 185 days.

(21) Appl. No.: 16/325,320

(22) PCT Filed: May 9, 2017

(86) PCT No.: PCT/JP2017/017453
§ 371 (c)(1),
(2) Date: Feb. 13, 2019

(87) PCT Pub. No.: WO2018/042764
PCT Pub. Date: Mar. 8, 2018

(65) Prior Publication Data
US 2019/0207404 A1    Jul. 4, 2019

(30) Foreign Application Priority Data
Aug. 30, 2016   (JP) .............................. JP2016-168511

(51) Int. Cl.
*H02J 7/00*     (2006.01)
*G01R 31/36*    (2020.01)
(Continued)

(52) U.S. Cl.
CPC ............. *H02J 7/0068* (2013.01); *G01K 7/22* (2013.01); *G01R 31/36* (2013.01); *H01M 10/44* (2013.01);
(Continued)

(58) Field of Classification Search
CPC ............................ H02J 7/0068; H02J 7/00309
(Continued)

(56) References Cited

U.S. PATENT DOCUMENTS

| | | | | |
|---|---|---|---|---|
| 5,637,982 A | * | 6/1997 | Nanno ................ | H02J 7/0068 |
| | | | | 320/150 |
| 2004/0232892 A1 | * | 11/2004 | Aradachi ............. | H02J 7/0091 |
| | | | | 320/150 |
| 2014/0147713 A1 | * | 5/2014 | Mizobe ............... | H01M 10/482 |
| | | | | 429/90 |

FOREIGN PATENT DOCUMENTS

| | | |
|---|---|---|
| JP | 2007-109536 A | 4/2007 |
| JP | 2013-99167 A | 5/2013 |

(Continued)

OTHER PUBLICATIONS

International Search Report dated Jun. 20, 2017, issued in counterpart application No. PCT/JP2017/017453 (2 pages).

*Primary Examiner* — Jerry D Robbins
(74) *Attorney, Agent, or Firm* — Westerman, Hattori, Daniels & Adrian, LLP (57) ABSTRACT

A first temperature detector detects a temperature in a high-temperature area and a temperature in a low-temperature area of a power storage unit based on an output value of a first temperature detection element provided at a first position in the high-temperature area and an output value of a temperature detection element provided at a predetermined position in the low-temperature area. A main controller controls charge and discharge based on the temperatures by the first temperature detector. A second temperature detector detects a temperature in the high-temperature area based on an output value of a second temperature detection element provided at a second position in the high-temperature area. A sub-controller controls charge and discharge based on the temperature detected by the second temperature detector during occurrence of an abnormality in the main controller.

5 Claims, 7 Drawing Sheets

(51) Int. Cl.
*H01M 10/6563* (2014.01)
*H02H 7/18* (2006.01)
*H01M 10/44* (2006.01)
*H01M 10/48* (2006.01)
*H01M 10/613* (2014.01)
*H01M 10/625* (2014.01)
*H01M 10/6557* (2014.01)
*H01M 10/633* (2014.01)
*G01K 7/22* (2006.01)
*H02J 7/34* (2006.01)

(52) U.S. Cl.
CPC ......... *H01M 10/443* (2013.01); *H01M 10/48* (2013.01); *H01M 10/486* (2013.01); *H01M 10/613* (2015.04); *H01M 10/625* (2015.04); *H01M 10/633* (2015.04); *H01M 10/6557* (2015.04); *H01M 10/6563* (2015.04); *H02H 7/18* (2013.01); *H02J 7/0063* (2013.01); *H02J 7/0091* (2013.01); *H02J 7/00309* (2020.01); *H02J 7/345* (2013.01); *H02J 2007/0067* (2013.01)

(58) Field of Classification Search
USPC ........................................................ 320/134
See application file for complete search history.

(56) References Cited

FOREIGN PATENT DOCUMENTS

| JP | 2014-107979 A | 6/2014 |
| JP | 2014-131452 A | 7/2014 |
| JP | 2014-164812 A | 9/2014 |

\* cited by examiner

| Case No. | State of each position | | | Result of difference temperature | | | Highest temperatur | Lowest temperatur |
|---|---|---|---|---|---|---|---|---|
| | t1 | t2 | t3 | Δ1 | Δ2 | Δ3 | | |
| 1 | × | ○ | ○ | NG | NG | OK | t2 + α | t3 |
| 2 | × | ○ | × | NG | NG | NG | Error | Error |
| 3 | × | × | ○ | NG | NG | NG | Error | Error |
| 4 | × | × | × | NG | NG | NG | Error | Error |
| 5 | ○ | ○ | ○ | OK | OK | OK | t1 | t3 |
| 6 | ○ | ○ | × | OK | NG | NG | t1 | t1 − β |
| 7 | ○ | × | ○ | NG | OK | NG | t1 | t3 |
| 8 | ○ | × | × | NG | NG | NG | Error | Error |

MANAGEMENT DEVICE AND POWER STORAGE SYSTEM

TECHNICAL FIELD

The present invention relates to a management device for managing a power storage unit and to an accumulator system or a power storage system.

BACKGROUND ART

In recent years, secondary batteries such as lithium ion batteries and nickel hydride batteries are used for various purposes. The secondary battery is used for, for example, an on-vehicle purpose for supplying electric power to a drive motor of an electric vehicle (EV), a hybrid electric vehicle (HEV), or a plug-in hybrid vehicle (PHV) and to an auxiliary on a vehicle, a power storage for a peak-shift or a backup, and so on.

A thermistor is typically provided in a power storage module including a plurality of cells so as to detect a temperature of the cells (see, for example, PLT 1). For example, in a nickel hydride battery, the detected temperature is used to detect a point in time at which full charge is reached. Many battery manufacturers specify a charge temperature range and a discharge temperature range and recommend that a battery is charged and discharged within these ranges. If a lithium ion battery is charged and discharged at a high temperature higher than the specified ranges, internal resistance decreases, leading to a risk of generation of smoke and fire. Furthermore, if the lithium ion battery is charged at a low temperature lower than the charge temperature range, the battery deteriorates markedly. Furthermore, if the lithium ion battery is discharged at a low temperature lower than the discharge temperature range, an output capacity decreases.

Four or more thermistors are provided in a conventional typical power storage module so as to measure temperatures at four or more positions. An abnormal value is excluded from these measurement values, and a highest temperature and a lowest temperature are decided from among remaining measurement values and are used for various kinds of control.

CITATION LIST

Patent Literature

PTL 1: Unexamined Japanese Patent Publication No. 2014-164812

SUMMARY OF THE INVENTION

In a case where abnormal heating of a cell that is being charged or discharged is detected by a thermistor, it is necessary to stop the charge or discharge by turning off a switch (e.g., a relay) provided between a power storage module and a load. This control system from detection of a high temperature to switch-off need be doubled from the perspective of ensuring safety.

A larger number of thermistors provided in a power storage module can achieve robuster temperature detection but leads to higher cost.

The present invention is made in light of such circumstances, and an object of the present invention is to provide a technique for achieving a temperature control system for a power storage unit at low cost while ensuring safety.

In order to solve the above problems, a management device according to an aspect of the present invention is a management device that manages a power storage unit including a plurality of cells, including: a first temperature detector that detects a temperature in a high-temperature area of the power storage unit and a temperature in a low-temperature area of the power storage unit based on an output value of a first temperature detection element for high-temperature detection provided at a first position in the high-temperature area of the power storage unit and an output value of a temperature detection element for low-temperature detection provided at a predetermined position in the low-temperature area of the power storage unit; a main controller that controls charge and discharge of the power storage unit based on the temperature in the high-temperature area and the temperature in the low-temperature area detected by the first temperature detector; a second temperature detector that detects a temperature in the high-temperature area of the power storage unit based on an output value of a second temperature detection element for high-temperature detection provided at a second position in the high-temperature area of the power storage unit; and a sub-controller that controls charge and discharge of the power storage unit based on the temperature in the high-temperature area detected by the second temperature detector during occurrence of an abnormality in the main controller. The output value of the second temperature detection element for high-temperature detection is also supplied to the first temperature detector, and the main controller calculates a first difference between the output value of the first temperature detection element for high-temperature detection and the output value of the second temperature detection element for high-temperature detection, a second difference between the output value of the first temperature detection element for high-temperature detection and the output value of the temperature detection element for low-temperature detection, and a third difference between the output value of the second temperature detection element for high-temperature detection and the output value of the temperature detection element for low-temperature detection, and uses, as an alternative value of the temperature in the high-temperature area of the power storage unit, a value obtained by adding a deviation from the output value of the first temperature detection element for high-temperature detection in a steady state to the output value of the second temperature detection element for high-temperature detection in a case where the first difference and the second difference are abnormal values and the third difference is a normal value.

Any desired combinations of the above-described configuration elements and converted expressions of the present invention in methods, devices, systems, and other similar entities are still effective as aspects of the present invention.

According to the present invention, it is possible to provide a temperature control system for a power storage unit at low cost while ensuring safety.

DESCRIPTION OF EMBODIMENTS

Figure 1:
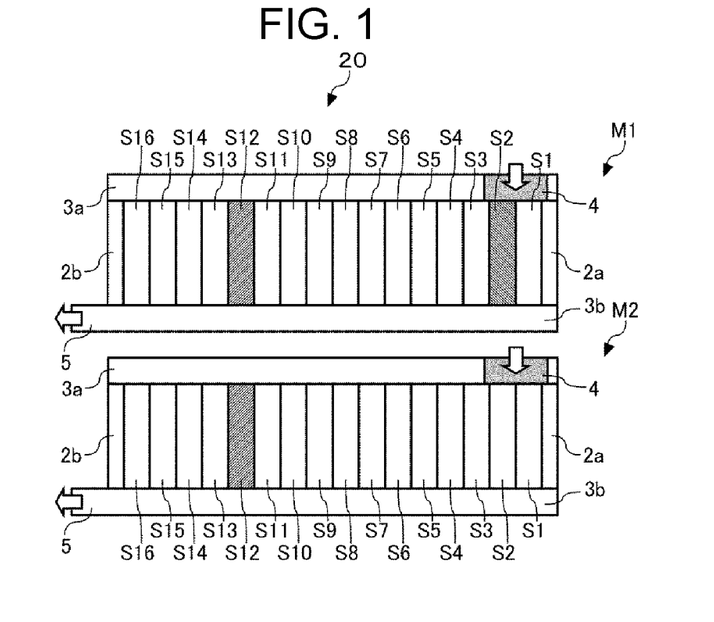
FIG. 1 is a schematic view illustrating an external appearance configuration of a power storage unit that constitutes a power storage system according to an exemplary embodiment of the present invention.

FIG. 1 is a schematic view illustrating an external appearance configuration of power storage unit 20 that constitutes a power storage system according to an exemplary embodiment of the present invention. Power storage unit 20 illustrated in FIG. 1 is constituted by two power storage modules, i.e., first power storage module (also called a power storage stack) M1 and second power storage module M2. First power storage module M1 includes a plurality of cells (first to sixteenth cells S1 to S16 in the present exemplary embodiment) that are connected in series. In the following description, it is assumed that prismatic lithium ion battery cells having a representative voltage in a range from 3.6 V to 3.7 V are used as first to sixteenth cells S1 to S16. Other kinds of cells such as nickel hydride battery cells, lead battery cells, electric double layer capacitor cells, or lithium ion capacitor cells can be used instead of lithium ion battery cells.

Two end plates 2a, 2b are provided on respective end surfaces of first to sixteenth cells S1 to S16 in a stacking direction so as to sandwich first to sixteenth cells S1 to S16. Two bind plates 3a, 3b that connect end plates 2a, 2b on the respective ends are provided on side surfaces of first to sixteenth cells S1 to S16 in a longitudinal direction.

A supply path through which an air refrigerant for cooling is supplied is provided on an inner side of bind plate 3a, and bind plate 3a is provided with air inlet 4 at a predetermined position on first cell S1 side. The air refrigerant entering from air inlet 4 is supplied to a cooling gap between adjacent two of first to sixteenth cells S1 to S16 through the supply path provided on an inner side of bind plate 3a.

A discharge path through which an air refrigerant for cooling is discharged is provided on an inner side of bind plate 3b on an opposite side, and bind plate 3b is provided with air outlet 5 at a front end of bind plate 3b on sixteenth cell S16 side. The air refrigerant discharged from the cooling gap between adjacent two of first to sixteenth cells S1 to S16 is discharged from air outlet 5 through the discharge path provided on the inner side of bind plate 3b.

First power storage module M1 and second power storage module M2 are disposed so as to be adjacent to each other, end plate 2a of first power storage module M1 and end plate 2a of second power storage module M2 are connected to each other by using a fixing jig (not illustrated), and end plate 2b of first power storage module M1 and end plate 2b of second power storage module M2 are connected to each other by using a fixing jig (not illustrated). In a case where first power storage module M1 and second power storage module M2 are connected in series, electrodes of different polarities are connected by using a fixing jig, and in a case where first power storage module M1 and second power storage module M2 are connected in parallel, electrodes of a same polarity are connected by using a fixing jig. For vehicle use, first power storage module M1 and second power storage module M2 stored in a case (not illustrated) are provided in a vehicle.

In the present exemplary embodiment, first thermistor T1 and second thermistor T2 for high-temperature detection are provided at respective two positions in first power storage module M1 and second power storage module M2, and third thermistor T3 for low-temperature detection is provided at a single position in first power storage module M1 or second power storage module M2. Positions at which first to third thermistors T1 to T3 are provided are determined based on a temperature distribution simulation of first power storage module M1 and second power storage module M2. Typically, in a case where a plurality of prismatic battery cells are stacked, vicinity of a center of the battery cells has a highest temperature. In a case where an air cooling mechanism is provided, a cell (second cell S2 in FIG. 1) closer to air inlet 4 has a lower temperature, and a cell (sixteenth cell S16 in FIG. 1) closer to air outlet 5 has a higher temperature.

Temperature distribution simulation of first power storage module M1 and second power storage module M2 showed that a temperature close to twelfth cell S12 of first power storage module M1 and twelfth cell S12 of second power storage module M2 is highest and a temperature close to second cell S2 of first power storage module M1 and second cell S2 of second power storage module M2 is lowest.

In view of this, in the present exemplary embodiment, first thermistor T1 for high-temperature detection is provided close to twelfth cell S12 of first power storage module M1, second thermistor T2 for high-temperature detection is provided close to twelfth cell S12 of second power storage module M2, and third thermistor T3 for low-temperature detection is provided close to second cell S2 of first power storage module M1. A thermistor for high-temperature detection is redundantly provided at two positions since a temperature detected by the thermistor for high-temperature detection is directly linked to control for ensuring safety of a power storage system. Meanwhile, a thermistor for low-temperature detection is provided only at a single position since a temperature detected by the thermistor for low-temperature detection is not directly linked to control for ensuring safety of a power storage system. This reduces cost.

Figure 2:
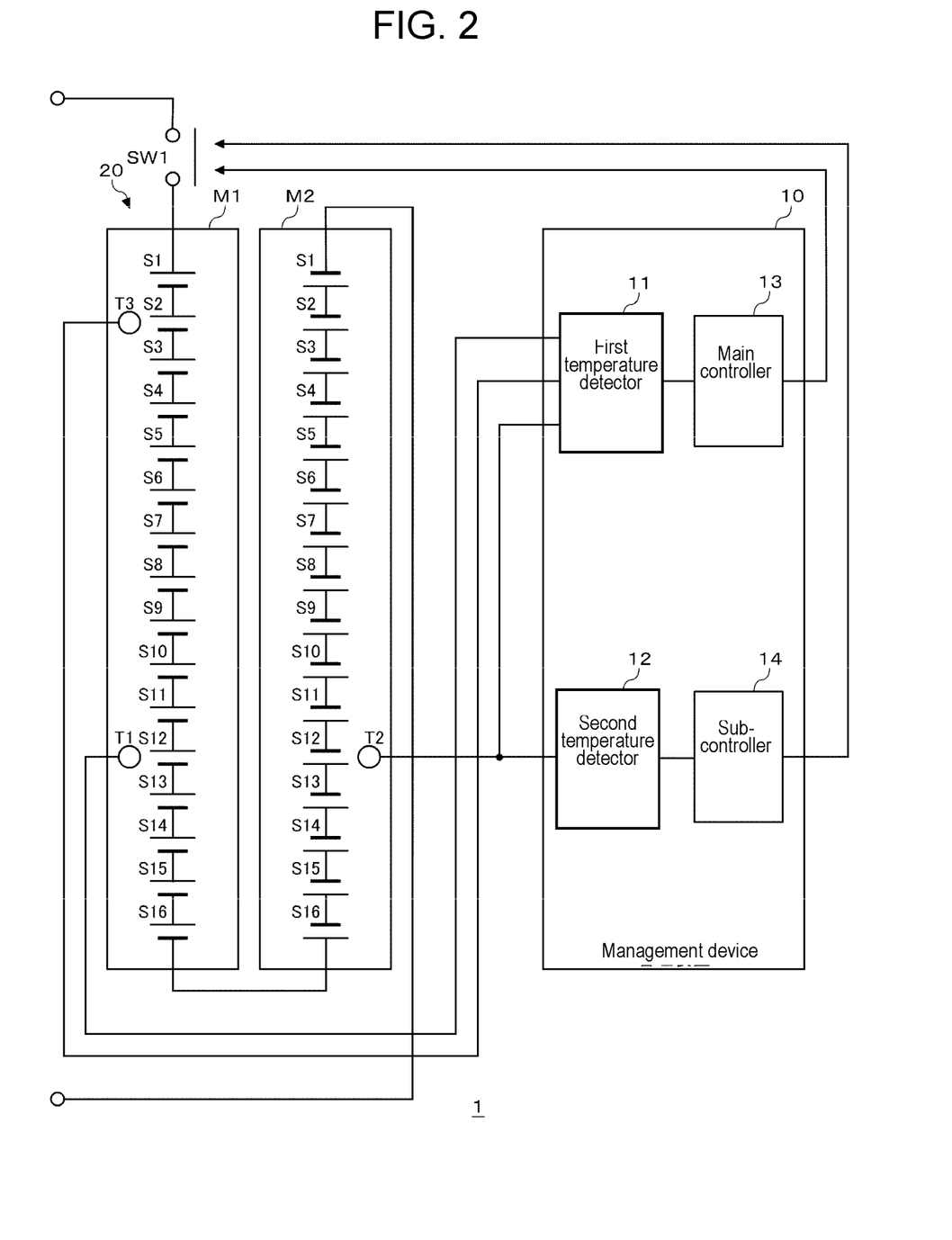
FIG. 2 illustrates a circuit configuration of a power storage system according to a first exemplary embodiment of the present invention.

FIG. 2 illustrates a circuit configuration of power storage system 1 according to the first exemplary embodiment of the present invention. Power storage system 1 according to the first exemplary embodiment includes power storage unit 20 constituted by first power storage module M1 and second power storage module M2 that are connected in series and management device 10 that manages power storage unit 20. Management device 10 includes first temperature detector 11, second temperature detector 12, main controller 13, and sub-controller 14. First temperature detector 11 and main controller 13 constitute a main control system, and second temperature detector 12 and sub-controller 14 constitute a redundant system.

First thermistor T1 for high-temperature detection and third thermistor T3 for low-temperature detection are temperature detection elements of the main control system and are connected to first temperature detector 11. First temperature detector 11 detects a temperature in a high-temperature area and a temperature in a low-temperature area of power storage unit 20 based on an output value of first thermistor T1 and an output value of third thermistor T3 and supplies the detected temperatures to main controller 13. First temperature detector 11 includes, for example, a voltage-dividing resistor, an amplifier, an AD converter.

Main controller 13 controls charge and discharge of power storage unit 20 based on the temperature in the high-temperature area and the temperature in the low-temperature area detected by first temperature detector 11, a voltage of each cell detected by a voltage detector (not illustrated), and an electric current flowing in power storage unit 20 detected by a current detector (not illustrated). The configuration of main controller 13 may be provided by hardware and software resources working together or hardware resources alone. A microcomputer, a digital signal processor (DSP), a field programmable gate array (FPGA), or another large scale integration (LSI) can be used as the hardware resource. The software resource may be a program such as firmware.

Main controller 13 stops charge or discharge by turning off switch SW1 provided between power storage unit 20 and a load (not illustrated) upon detection of an overvoltage, an undervoltage, an overcurrent, a high-temperature abnormality, or a low-temperature abnormality. A relay or a semiconductor switch can be used as switch SW1. Main controller 13 controls state-of-charge (SOC), state-of-health (SOH), and equalization.

Second thermistor T2 for high-temperature detection is a temperature detection element of the redundant system and is connected to second temperature detector 12. Second temperature detector 12 detects a temperature in the high-temperature area of power storage unit 20 based on an output value of second thermistor T2 and supplies the detected temperature to sub-controller 14. Second temperature detector 12 includes, for example, a voltage-dividing resistor, an amplifier, an AD converter.

Sub-controller 14 controls charge and discharge of power storage unit 20 based on the temperature in the high-temperature area of power storage unit 20 detected by second temperature detector 12. In the first exemplary embodiment, sub-controller 14 is specialized for control during a high-temperature abnormality and is constituted by a simple hardware circuit that turns off switch SW1 when the temperature detected by second temperature detector 12 exceeds a threshold value for determination of a high-temperature abnormality.

As described above, a high-temperature abnormality of power storage unit 20 is a most dangerous event that increases a risk of smoke and fire generation and therefore has a high need for redundancy. Even in a case where the main control system stops operating because of occurrence of an abnormality in the main control system, redundant system need be designed to turn off switch SW1 upon occurrence of a high-temperature abnormality in power storage unit 20.

An upper limit of a range of a temperature determined by sub-controller 14 is set higher than an upper limit of a range of a temperature determined by main controller 13 so that main controller 13 always operates preferentially over sub-controller 14. For example, the upper temperature is set to 65° C. in main controller 13 and the upper temperature is set to 68° C. in sub-controller 14, and therefore upon occurrence of a high-temperature abnormality, main controller 13 detects the abnormality earlier than sub-controller 14 and turns off switch SW1. Sub-controller 14 may be inactive while main controller 13 is normally operating. In this case, upon receipt of a deactivation signal from main controller 13, sub-controller 14 activates its control of switch SW1 and turns off switch SW1 when the temperature detected by second temperature detector 12 exceeds the threshold value for determination of a high-temperature abnormality.

Figure 3:
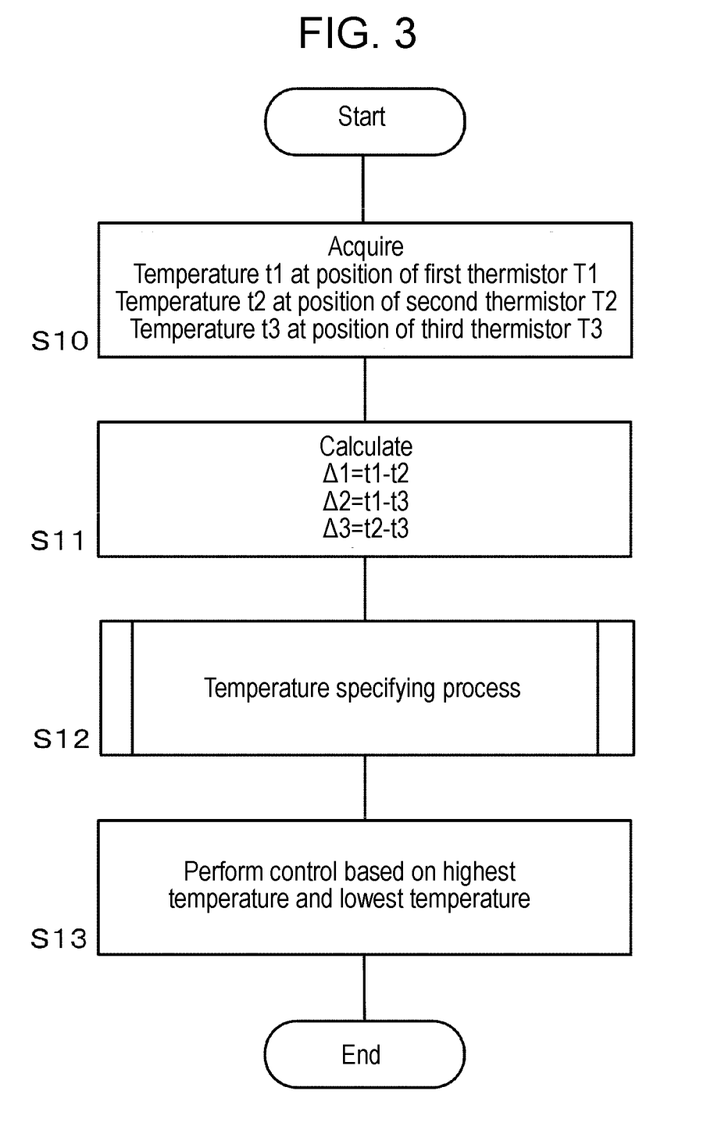
FIG. 3 is a flowchart illustrating operation of a main controller according to the first exemplary embodiment.

FIG. 3 is a flowchart illustrating operation of main controller 13 according to the first exemplary embodiment. Main controller 13 acquires first temperature t1 at the position where first thermistor T1 is provided and third temperature t3 at the position where third thermistor T3 is provided from first temperature detector 11 and acquires second temperature t2 at the position where second thermistor T2 is provided from second temperature detector 12 (S10).

Main controller 13 calculates first difference temperature $\Delta 1$ between first temperature t1 and second temperature t2, second difference temperature $\Delta 2$ between first temperature t1 and third temperature t3, and third difference temperature $\Delta 3$ between second temperature t2 and third temperature t3 (S11). These differences may be always calculated irrespective of whether or not first to third temperatures t1 to t3 are out of the charge and discharge temperature ranges or may be calculated in a case where at least one of first temperature t1 and third temperature t3 is out of the charge and discharge temperature ranges.

Main controller 13 specifies a highest temperature and a lowest temperature of power storage unit 20 based on first temperature t1, second temperature t2, third temperature t3, first difference temperature $\Delta 1$, second difference temperature $\Delta 2$, and third difference temperature $\Delta 3$ (S12). This temperature specifying process also serves as a failure determination process for determining failure of first thermistor T1 and first temperature detector 11. In this failure determination process, failure of a wire connected to first thermistor T1 and failure of a wire connected to first temperature detector 11 are also detected. Main controller 13 performs various kinds of control on power storage unit 20 based on the specified highest temperature and lowest temperature (S13).

Figure 4:
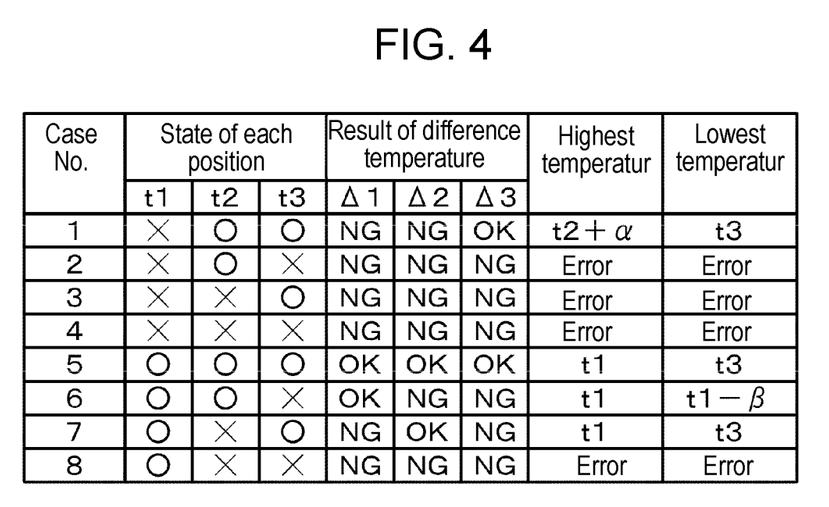
FIG. 4 illustrates a reference table referred to in a temperature specifying process in step S12 of FIG. 3.

FIG. 4 illustrates a reference table referred to in the temperature specifying process in step S12 of FIG. 3. As illustrated in FIG. 4, in a case where two or more of first temperature t1, second temperature t2, and third temperature t3 are abnormal values (cases 2, 3, 4, and 8), all of first difference temperature $\Delta 1$, second difference temperature $\Delta 2$, and third difference temperature $\Delta 3$ become abnormal values (NG) that exceed an allowable value. In this case, main controller 13 cannot specify a highest temperature and a lowest temperature of power storage unit 20, outputs an error, and turns off switch SW1. The error is also sent to sub-controller 14.

In a case where all of first temperature t1, second temperature t2, and third temperature t3 are normal values (case 5), all of first difference temperature $\Delta 1$, second difference temperature $\Delta 2$, and third difference temperature $\Delta 3$ become normal values (OK). In this case, main controller 13 sets first temperature t1 as a highest temperature of power storage unit 20 and sets third temperature t3 as a lowest temperature of power storage unit 20.

In a case where first temperature t1 and third temperature t3 are normal values and second temperature t2 is an abnormal value (case 7), first difference temperature $\Delta 1$ and third difference temperature $\Delta 3$ become abnormal values (NG), and second difference temperature $\Delta 2$ becomes a normal value (OK). In this case, main controller 13 sets first temperature t1 as a highest temperature of power storage unit 20 and sets third temperature t3 as a lowest temperature of power storage unit 20. Case 7 is handled in a similar manner to case 5 since it is a case in which abnormality occurs not in the main control system but in redundant second thermistor T2.

In a case where second temperature t2 and third temperature t3 are normal values and first temperature t1 is an abnormal value (case 1), first difference temperature $\Delta 1$ and second difference temperature $\Delta 2$ become abnormal values (NG) and third difference temperature $\Delta 3$ becomes a normal value (OK). In this case, main controller 13 sets a temperature obtained by adding deviation α to second temperature t2 as a highest temperature of power storage unit 20 and sets third temperature t3 as a lowest temperature of power storage unit 20.

Deviation α is a measurement value of an error between first temperature t1 and second temperature t2 in a steady state. The error is a value obtained by adding up a measurement error resulting from variations of elements such as a thermistor, an amplifier, and an AD converter and a temperature error resulting from a difference in position between first thermistor T1 and second thermistor T2. In a case where there is no temperature error resulting from the difference in position, the measurement error resulting from the variations of the elements becomes deviation α.

In a case where first temperature t1 and second temperature t2 are normal values and third temperature t3 is an abnormal value (case 6), first difference temperature Δ1 becomes a normal value (OK), and second difference temperature Δ2 and third difference temperature Δ3 become abnormal values (NG). In this case, main controller 13 sets second temperature t2 as a highest temperature of power storage unit 20 and sets a temperature obtained by subtracting estimated value β of a temperature difference between first temperature t1 and third temperature t3 from first temperature t1 as a lowest temperature of power storage unit 20. Estimated value β of the temperature difference may be a maximum temperature difference between first temperature t1 and third temperature t3 measured in a steady state or may be an average temperature difference between first temperature t1 and third temperature t3 measured in a steady state.

Figure 5:
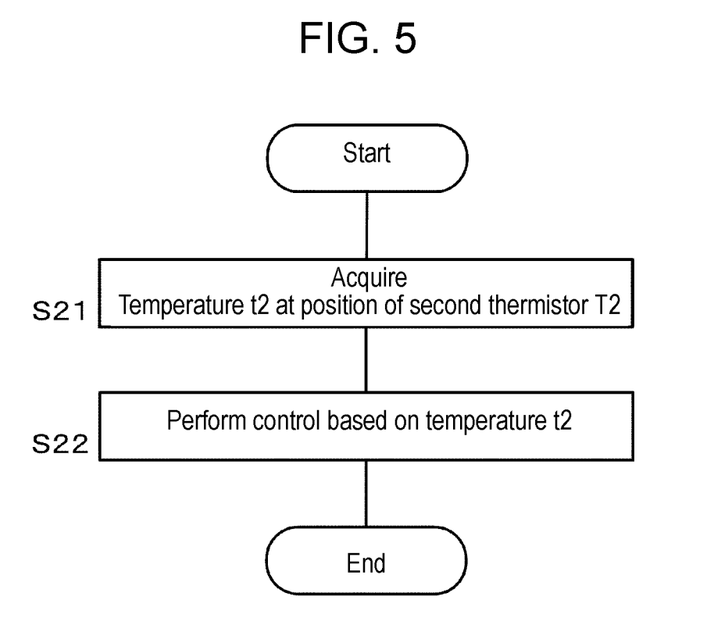
FIG. 5 is a flowchart illustrating operation of a sub-controller according to the first exemplary embodiment.

FIG. 5 is a flowchart illustrating operation of sub-controller 14 according to the first exemplary embodiment. Sub-controller 14 acquires second temperature t2 at the position where second thermistor T2 is provided from second temperature detector 12 (S21). Sub-controller 14 performs control during a high-temperature abnormality of power storage unit 20 based on second temperature t2 (S22).

As described above, according to the first exemplary embodiment, three thermistors, i.e., first thermistor T1 and second thermistor T2 for high-temperature detection and third thermistor T3 for low-temperature detection are provided in power storage unit 20. This can provide a temperature control system for power storage unit 20 at low cost while ensuring safety. By keeping the number of disposed thermistors up to three, cost can be reduced. In this case, two thermistors for high-temperature detection are provided, and second thermistor T2 for high-temperature detection is connected to a redundant system (second temperature detector 12 and sub-controller 14) independent of a main control system (first temperature detector 11 and main controller 13). This can ensure safety. Since the redundant system is specialized for backup of control during a high-temperature abnormality, cost of sub-controller 14 can be reduced.

Furthermore, an output of second thermistor T2 for high-temperature detection is also supplied to the main control system. This allows main controller 13 to continue temperature control even in a case where failure occurs in first thermistor T1 or third thermistor T3. In a case where one of three difference temperatures is a normal value, two of three thermistors are normal (cases 1, 6, and 7), as illustrated in FIG. 4. In a case where first thermistor T1 and third thermistor T3 are normal and second thermistor T2 for backup is abnormal (case 7), measurement values obtained by first thermistor T1 and third thermistor T3 are used as they are.

In a case where second thermistor T2 and third thermistor T3 are normal and first thermistor T1 is abnormal (case 1), a value obtained by adding deviation α to a measurement value of second thermistor T2 for backup is used as an alternative value of a measurement value of first thermistor T1. This makes it possible to avoid a situation where charge and discharge operation of power storage unit 20 stops due to failure of first thermistor T1.

In a case where first thermistor T1 and second thermistor T2 are normal and third thermistor T3 is abnormal (case 6), a value obtained by subtracting estimated value β of the temperature difference from a measurement value of first thermistor T1 is used as an alternative value of a measurement value of third thermistor T3. This makes it possible to avoid a situation where charge and discharge operation of power storage unit 20 stops due to failure of third thermistor T3.

In a case where first temperature t1 of first thermistor T1 is normal, a value obtained by subtracting estimated value β of the temperature difference from a measurement value of first thermistor T1 may be used as an alternative value of a measurement value of third thermistor T3 without determining whether first difference temperature Δ1 between first temperature t1 and second temperature t2 of second thermistor T2 is normal or abnormal. However, in this case, a highest temperature and a lowest temperature of power storage unit 20 are based only on first temperature t1 of first thermistor T1. This is not preferable from the perspective of safety. Meanwhile, by confirming that first difference temperature Δ1 is normal, it is more firmly determined that first thermistor T1 is normal. This allows a value obtained by subtracting estimated value β of the temperature difference from a measurement value of first thermistor T1 to be used as a lowest temperature.

Figure 6:
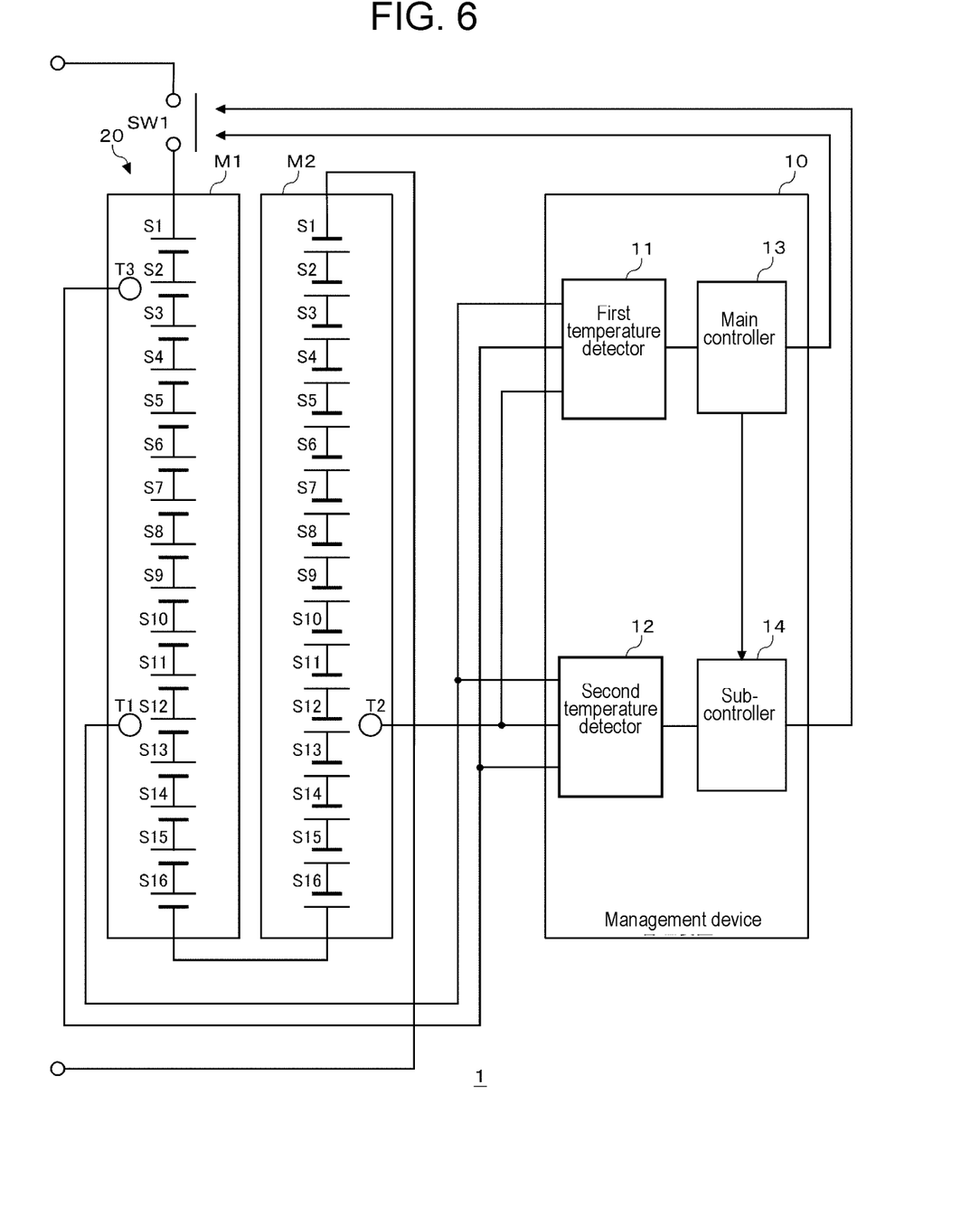
FIG. 6 illustrates a circuit configuration of a power storage system according to a second exemplary embodiment of the present invention.

FIG. 6 illustrates a circuit configuration of accumulator system 1 according to the second exemplary embodiment of the present invention. In power storage system 1 according to the second exemplary embodiment, a controller that is identical or substantially equivalent to main controller 13 is used as sub-controller 14, and sub-controller 14 backs up all or substantially all kinds of control of main controller 13. In the second exemplary embodiment, first thermistor T1 for high-temperature detection and third thermistor T3 for low-temperature detection are also connected to second temperature detector 12. Operation of main controller 13 according to the second exemplary embodiment is identical to operation of main controller 13 according to the first exemplary embodiment illustrated in the flowchart of FIG. 3.

Figure 7:
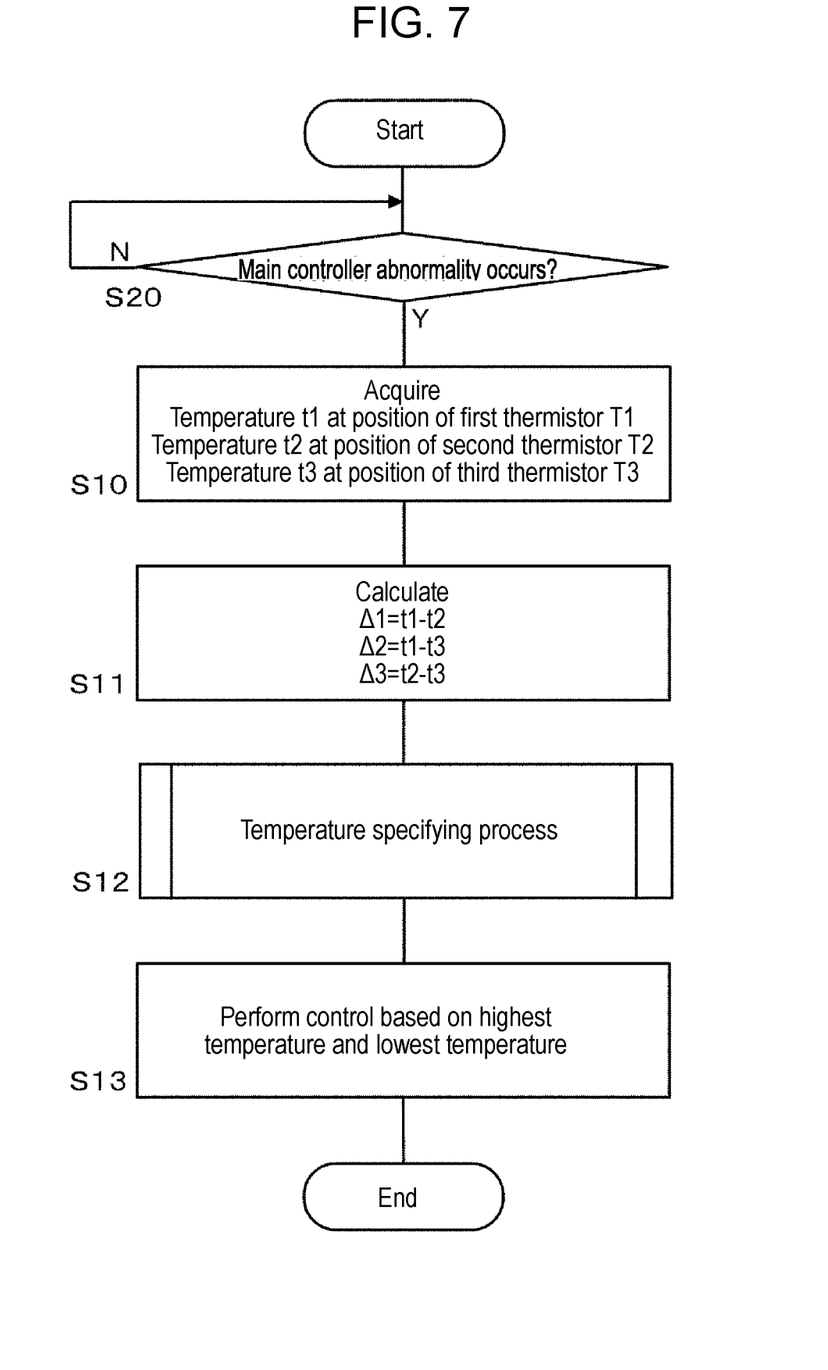
FIG. 7 is a flowchart illustrating operation of a sub-controller according to the second exemplary embodiment.

FIG. 7 is a flowchart illustrating operation of sub-controller 14 according to the second exemplary embodiment. Sub-controller 14 determines whether or not an abnormality is occurring in main controller 13 (S20). Examples of this abnormality include an abnormality of a wire between main controller 13 and switch SW1 and a temperature detection abnormality in addition to an abnormality of main controller 13 itself. The temperature detection abnormality is cases, 2, 3, 4, and 8 of FIG. 4. In a case where an abnormality is occurring in main controller 13 (Y in S20), sub-controller 14 performs processes similar to the processes in steps S10 to S13 performed by main controller 13 of FIG. 3.

That is, sub-controller 14 acquires first temperature t1 at the position where first thermistor T1 is provided and third temperature t3 at the position where third thermistor T3 is provided from first temperature detector 11 and acquires second temperature t2 at the position where second thermistor T2 is provided from second temperature detector 12 (S10). Sub-controller 14 calculates first difference temperature Δ1 between first temperature t1 and second temperature t2, second difference temperature Δ2 between first temperature t1 and third temperature t3, and third difference temperature Δ3 between second temperature t2 and third temperature t3 (S11). Sub-controller 14 specifies a highest temperature and a lowest temperature of power storage unit 20 based on first temperature t1, second temperature t2, third temperature t3, first difference temperature Δ1, second difference temperature Δ2, and third difference temperature Δ3 (S12). Sub-controller 14 performs various kinds of control on power storage unit 20 based on the specified highest temperature and lowest temperature (S13).

Sub-controller 14 may perform the temperature specifying process in step S12 based on the reference table illustrated in FIG. 4 or may perform the temperature specifying process in step S12 based on the reference table illustrated in FIG. 4 modified so that first temperature t1 and second temperature t2 are replaced with each other.

According to the second exemplary embodiment described above, richer backup can be realized by using three thermistors than in the first exemplary embodiment. That is, even in a case where an abnormality occurs in main controller 13, sub-controller 14 can perform control equivalent to control performed by main controller 13.

The present invention has been described based on the exemplary embodiments. It is to be understood by the person of ordinary skill in the art that the exemplary embodiments are examples, and various modifications of each of configuration elements and combinations of each treatment process may be made and the modifications are included within the scope of the present invention.

In the above exemplary embodiments, temperature control of a power storage unit including two power storage modules, i.e., first power storage module M1 and second power storage module M2 has been described. In this respect, the present invention is also applicable to temperature control of power storage unit 20 including a single power storage module. For example, first thermistor T1 for high-temperature detection is provided close to twelfth cell S12 of first power storage module M1, second thermistor T2 for high-temperature detection is provided close to eleventh cell S11 of first power storage module M1, and third thermistor T3 for low-temperature detection is provided close to second cell S2 of first power storage module M1. Circuit configurations of the main control system and redundant system are similar to those in the above exemplary embodiments.

Furthermore, for use in which a temperature in a case is relatively uniform, the present invention is also applicable to temperature control of a power storage unit including three or more power storage modules.

The exemplary embodiments may be specified by items described below.

[Item 1]

Management device (10) that manages power storage unit (20) including a plurality of cells (S1 to S16), including first temperature detector (11) that detects a temperature in a high-temperature area of power storage unit (20) and a temperature in a low-temperature area of power storage unit (20) based on an output value of first temperature detection element (T1) for high-temperature detection provided at a first position in the high-temperature area of power storage unit (20) and an output value of temperature detection element (T3) for low-temperature detection provided at a predetermined position in the low-temperature area of power storage unit (20);

main controller (13) that controls charge and discharge of power storage unit (20) based on the temperatures in the high-temperature area and the low-temperature area detected by first temperature detector (11);

second temperature detector (12) that detects a temperature in the high-temperature area of power storage unit (20) based on an output value of second temperature detection element (T2) for high-temperature detection provided at a second position in the high-temperature area of power storage unit (20);

sub-controller (14) that controls charge and discharge of power storage unit (20) based on the temperature in the high-temperature area detected by second temperature detector (12) during occurrence of an abnormality in main controller (13), wherein the output value of second temperature detection element (T2) for high-temperature detection is also supplied to first temperature detector (11), and main controller (13) calculates a first difference between the output value of first temperature detection element (T1) for high-temperature detection and the output value of second temperature detection element (T2) for high-temperature detection, a second difference between the output value of first temperature detection element (T1) for high-temperature detection and the output value of temperature detection element (T3) for low-temperature detection, and a third difference between the output value of second temperature detection element (T2) for high-temperature detection and the output value of temperature detection element (T3) for low-temperature detection, and uses, as an alternative value of the temperature in the high-temperature area of power storage unit (20), a value obtained by adding a deviation from the output value of first temperature detection element (T1) for high-temperature detection in a steady state to the output value of second temperature detection element (T2) for high-temperature detection in a case where the first difference and the second difference are abnormal values and the third difference is a normal value.

This makes it possible to provide a temperature control system for power storage unit (20) at low cost while ensuring safety. Furthermore, it is possible to realize design that prevents temperature control of main controller (13) from being stopped as much as possible.

[Item 2]

The management device (10) according to item 1, wherein main controller (13) uses, as an alternative value of the temperature in the low-temperature area of power storage unit (20), a value obtained by subtracting an estimated value of a temperature difference between the temperature in the high-temperature area and the temperature in the low-temperature area in power storage unit (20) from the output value of first temperature detection element (T1) for high-temperature detection in a case where the second difference and the third difference are abnormal values and the first difference is a normal value.

This makes it possible to realize design that prevents temperature control of main controller (13) from being stopped as much as possible.

[Item 3]

The management device (10) according to item 1 or 2 the output value of first temperature detection element (T1) for high-temperature detection and the output value of temperature detection element (T3) for low-temperature detection are also supplied to second temperature detector (12), and sub-controller (14) calculates the first difference, the second difference, and the third difference and uses, as an alternative value of the temperature in the high-temperature area of power storage unit (20), a value obtained by adding a deviation from the output value (T1) of first temperature detection element for high-temperature detection in a steady state to the output value of second temperature detection element (T2) for high-temperature detection in a case where the first difference and the second difference are abnormal values and the third difference is a normal value.

According to this configuration, even in a case where an abnormality occurs in main controller (13), sub-controller (14) can perform control equivalent to control performed by main controller (13).

[Item 4]

The management device (10) according any one of items 1 through 3, wherein power storage unit (20) includes first power storage module (M1) including a plurality of cells (S1 to S16) and second power storage module (M2) including a plurality of cells (S1 to S16);

first power storage module (M1) and second power storage module (M2) are connected to each other;

first temperature detection element (T1) for high-temperature detection is provided in a high-temperature area of first power storage module (M1);

second temperature detection element (T2) for high-temperature detection is provided in a high-temperature area of second power storage module (M2);

temperature detection element (T3) for low-temperature detection is provided in a low-temperature area of first power storage module (M1).

This makes it possible to realize temperature control of power storage unit (20) including two power storage modules by using three temperature detection elements (T1, T2, and T3) while ensuring safety.

[Item 5]

Power storage system (1) including:

power storage unit (20);

management device (10) according to any one of items 1 to 4 that manages power storage unit (20).

This makes it possible to provide a temperature control system for power storage unit (20) of power storage system (1) at low cost while ensuring safety. Furthermore, it is possible to realize design that prevents temperature control of main controller (13) from being stopped as much as possible.

The invention claimed is:

1. A management device that manages a power storage unit including a plurality of cells, comprising:
 a first temperature detector that detects a temperature in a high-temperature area of the power storage unit and a temperature in a low-temperature area of the power storage unit based on an output value of a first temperature detection element for high-temperature detection provided at a first position in the high-temperature area of the power storage unit and an output value of a temperature detection element for low-temperature detection provided at a predetermined position in the low-temperature area of the power storage unit;
 a main controller that controls charge and discharge of the power storage unit based on the temperature in the high-temperature area and the temperature in the low-temperature area detected by the first temperature detector;
 a second temperature detector that detects a temperature in the high-temperature area of the power storage unit based on an output value of a second temperature detection element for high-temperature detection provided at a second position in the high-temperature area of the power storage unit; and
 a sub-controller that controls charge and discharge of the power storage unit based on the temperature in the high-temperature area detected by the second temperature detector during occurrence of an abnormality in the main controller,
wherein
the output value of the second temperature detection element for high-temperature detection is also supplied to the first temperature detector, and
the main controller calculates a first difference between the output value of the first temperature detection element for high-temperature detection and the output value of the second temperature detection element for high-temperature detection, a second difference between the output value of the first temperature detection element for high-temperature detection and the output value of the temperature detection element for low-temperature detection, and a third difference between the output value of the second temperature detection element for high-temperature detection and the output value of the temperature detection element for low-temperature detection, and uses, as an alternative value of the temperature in the high-temperature area of the power storage unit, a value obtained by adding a deviation from the output value of the first temperature detection element for high-temperature detection in a steady state to the output value of the second temperature detection element for high-temperature detection in a case where the first difference and the second difference are abnormal values and the third difference is a normal value.

2. The management device according to claim 1, wherein the main controller uses, as an alternative value of the temperature in the low-temperature area of the power storage unit, a value obtained by subtracting an estimated value of a temperature difference between the temperature in the high-temperature area and the temperature in the low-temperature area in the power storage unit from the output value of the first temperature detection element for high-temperature detection in a case where the second difference and the third difference are abnormal values and the first difference is a normal value.

3. The management device according to claim 1, wherein the output value of the first temperature detection element for high-temperature detection and the output value of the temperature detection element for low-temperature detection are also supplied to the second temperature detector, and
the sub-controller calculates the first difference, the second difference, and the third difference and uses, as an alternative value of the temperature in the high-temperature area of the power storage unit, a value obtained by adding a deviation from the output value of the first temperature detection element for high-temperature detection in a steady state to the output value of the second temperature detection element for high-temperature detection in a case where the first difference and the second difference are abnormal values and the third difference is a normal value.

4. The management device according to claim 1, wherein
the power storage unit includes a first power storage module including a plurality of cells and a second power storage module including a plurality of cells;
the first power storage module and the second power storage module are connected to each other;
the first temperature detection element for high-temperature detection is provided in a high-temperature area of the first power storage module;
the second temperature detection element for high-temperature detection is provided in a high-temperature area of the second power storage module; and
the temperature detection element for low-temperature detection is provided in a low-temperature area of the first power storage module.

5. A power storage system comprising:
a power storage unit; and
the management device according to claim 1 that manages the power storage unit.

\* \* \* \* \*